United States Patent [19]
Rogers et al.

[11] Patent Number: 6,087,220
[45] Date of Patent: Jul. 11, 2000

[54] STACK ETCH METHOD FOR FLASH MEMORY DEVICES

[75] Inventors: Daty Michael Rogers, Garland; Reima T. Laaksonen; Cetin Kaya, both of Dallas; Freidoon Mehrad, Plano; Men-Chee Chen, Dallas, all of Tex.

[73] Assignee: Texas Instruments Incorporated, Dallas, Tex.

[21] Appl. No.: 09/124,798

[22] Filed: Jul. 29, 1998

Related U.S. Application Data

[60] Provisional application No. 60/054,319, Jul. 31, 1997.

[51] Int. Cl.⁷ ................................ H01L 21/336
[52] U.S. Cl. .......................... 438/257; 438/264
[58] Field of Search ..................... 438/257, 261, 438/258, 288, 585, 593, 594, 738, 735, 691, 692

[56] References Cited

U.S. PATENT DOCUMENTS 5,915,177   5/1999   Tseng ........................................ 438/264

*Primary Examiner*—David Nelms
*Assistant Examiner*—Quoc Hoang
*Attorney, Agent, or Firm*—Jqacqueline J. Garner; W. James Brady, III; Frederick J. Telecky, Jr.

[57] ABSTRACT

A method of forming a floating gate memory array is provided that uses a two step etch process to prevent the formation of unwanted trenches 66 into the semiconductor substrate 26. The process may be accomplished by a first etch which is substantially not selective between silicon and dielectric materials. A second etch process is then used which is highly selective to dielectric materials.

14 Claims, 4 Drawing Sheets

6,087,220

STACK ETCH METHOD FOR FLASH MEMORY DEVICES

This application claims priority under 35 USC §119 (e) (1) of Provisional application Ser. No. 60/054,319, filed Jul. 31, 1997.

TECHNICAL FIELD OF THE INVENTION

This invention relates generally to the field of electronic devices and more particularly to a stack etch method for flash memory devices.

BACKGROUND OF THE INVENTION

One type of modern nonvolatile memory is the EPROM or EEPROM device that uses a floating gate structure. The memory cells within these devices use channel hot electrons for programming from the drain side and use Fowler-Nordheim tunneling for erasure from the source side. The gate structure for these devices is typically a stack configuration comprising a floating gate and a control gate separated by an insulator layer.

The formation of the stacked gate structure involves the deposition and patterning of two separate conductive layers. The inner layer is used to form the floating gate structures and is patterned so that each floating gate structure for each cell is separated from adjacent cells. The outward conductive layer forms the control gate and is typically used to connect adjacent cells to form a word line. The sequence of etch steps which are used to isolate the floating gate structures can sometimes result in the inadvertent etching of other semiconductor surfaces within the memory array. These processes can result in the formation of holes or trenches in areas of the semiconductor substrate where such features are not desired. For example, an unwanted hole or trench in the connected source region within a memory array can make it difficult or less efficient to implant dopings within the source region to make the source region as conductive as possible.

Accordingly, a need has arisen for a processing method which provides for the formation of the stacked gate structure for use in the floating gate memory array, but which does not produce unwanted holes or trenches in other portions of the array.

SUMMARY OF THE INVENTION

In accordance with the teachings of the present invention a stack etch method for flash memory device is provided that substantially eliminates or reduces disadvantages associated with prior techniques and processes.

In accordance with one embodiment of the present invention a method of forming a memory array is provided that comprises the steps of etching with a substantially nonselective etch process a semiconductor substrate having a first conductive layer formed outwardly from a surface of the semiconductor substrate and a second conductor layer formed outwardly from the first conductive layer. The first conductive layer is discontinuous such that portions of the second conductive layer are not separated from the surface of the semiconductor substrate by the first conductive layer. The first and second conductive layers are separated by a dielectric layer. The substantially nonselective etch process operates to create a substantially planar surface comprising exposed portions of the first and second conductive layers through the nonselective etching of the first conductive layer, the dielectric layer and the second conductive layer. The method further comprises the step of etching the substantially planar outer surface with a second etch process that is highly selective to oxide such that the remaining portions of the first and second conductive layer are removed. The first conductive layer are separated from the substrate surface by a gate oxide layer and the second etch process is operable to expose the gate oxide layer.

BRIEF DESCRIPTION OF THE DRAWINGS

A more complete understanding of the teachings of the present invention may acquired by referring to the accompanying figures in which like reference numbers indicate a like features and wherein.

DETAILED DESCRIPTION OF THE INVENTION

Figure 1:
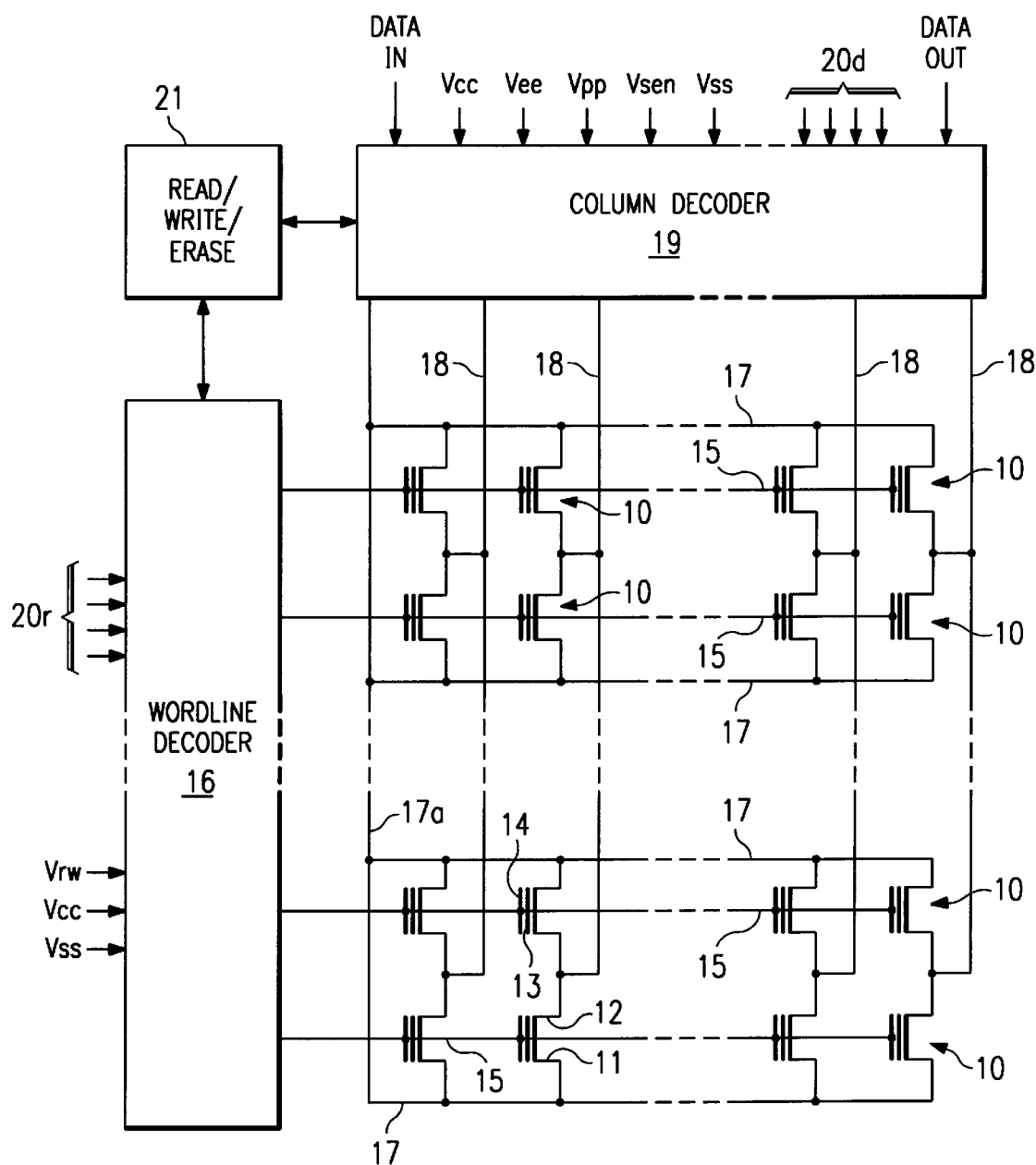
FIG. 1 is an electrical schematic diagram, in partial block form, of a memory cell array.

Referring now to FIG. 1, an example of memory cells, which is an integral part of a memory chip, is shown for the purpose of illustrating use of this invention. Each cell is a floating-gate transistor 10 having a source 11, a drain 12, a floating gate 13 and a control gate 14.

Each of the control gates 14 in a row of cells 10 is connected to a wordline 15, and each of the word lines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a column line 17a to a column decoder 19 and each of the drain-column lines 18 is connected to the column decoder 19.

In a write or program mode, the wordline decoder 16 may function, in response to wordline address signals on lines 20r and to signals from Read/Write/Erase control circuit 21, (or microprocessor 21) to place a preselected first programming voltage Vrw (approx. +12V) on a selected wordline 15, including a selected control-gate conductor 14. Column decoder 19 also functions to place a second programming voltage Vpp (approx. +5 to +10V) on a selected drain-column line 18 and, therefore, the drain 12 of selected cell 10. Source lines 17 are connected to reference potential Vss. All of the deselected drain-column lines 18 are connected to reference potential Vss. These programming voltages create a high current (drain 12 to source 11) condition in the channel of the selected memory cell 10, resulting in the generation near the drain-channel junction of channel-hot electrons and avalanche-breakdown electrons that are injected across the gate oxide to the floating gate 13 of the selected cell 10. The programming time is selected to be sufficiently long to program the floating gate 13 with a negative program charge of approximately −2V to −6V with respect to the gate region. For memory cells 10 fabricated in accordance with the preferred embodiment, the coupling coefficient between a control gate 14/wordline 15 and a floating gate 13 is approximately 0.5. Therefore, a programming voltage Vrw of 12 volts, for example, on a selected wordline 15, including the selected gate control 14, places a voltage of approximately +5 to +6V on the selected floating gate 13. The floating gate 13 of the selected cell 10 is charged with channel-hot electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash erase mode, the column decoder 19 may function to leave all drain-column lines 18 floating. The wordline decoder 16 functions to connect all the word lines 15 to reference potential Vss. The column decoder 19 also functions to apply a high positive voltage Vee (approx. +10V to +15V) to all the source lines 17. These erasing voltages create sufficient field strength across the tunneling area between gate 13 and the substrate to generate a Fowler-Nordheim tunnel current that transfers charge from the floating gate 13, erasing the memory cell 10. A desirable erased threshold voltage value (which is close to the ultraviolet-erased value) is achieved by this invention and is described later.

In the read mode, the wordline decoder 16 functions, in response to wordline address signals on line 20r and to signals from Read/Write/Erase control circuit 21, to apply a preselected positive voltage Vcc (approx. +5V) to the selected wordline 15, and to apply a low voltage (ground or Vss) to deselected word lines 15. The column decoder 19 functions to apply a preselected positive voltage Vsen (approx. +1.0V) to at least the selected drain column line 18 and to apply a low voltage (0V) to the source line 17. The column decoder 19 also functions, in response to a signal on address lines 20d, to connect the selected drain-column line 18 of the selected cell 10 to the DATA OUT terminal. The conductive or non-conductive state of the cell 10 connected to the selected drain-column line 18 and the selected wordline 15 is detected by a sense amplifier (not shown) connected to the DATA OUT terminal. The read voltages applied to the memory array are sufficient to determine channel impedance for a selected cell 10 but are insufficient to determine channel impedance for a selected cell 10 but are insufficient to create either hot-carrier injection or Fowler-Nordheim tunneling that would disturb the charge condition of any floating gate 13.

For convenience, a table of read, write and erase voltages is given in TABLE 1 below:

TABLE 1

|  | Read | Write | Flash Erase |
| --- | --- | --- | --- |
| Selected Wordline | 5V | 12V | 0V (All) |
| Deselected Word lines | 0V | 0V | — |
| Selected Drain Line | 1.0V | 5–10V | Float (All) |
| Deselected Drain Lines | Float | 0V | — |
| Source lines | 0V | About 0V | 10–15V (All) |

Figure 2:
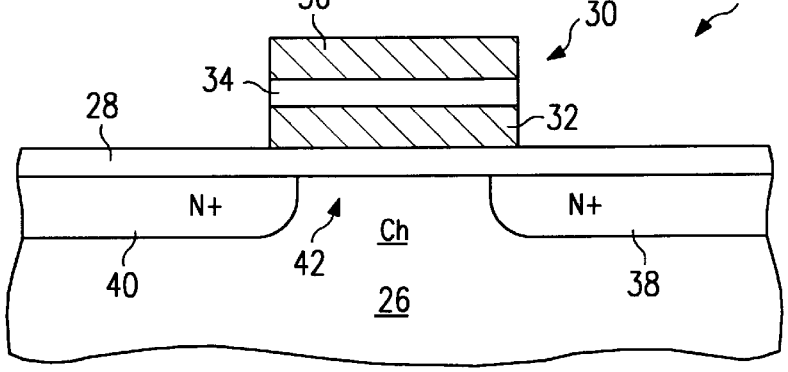
FIG. 2 is a cross-sectional view of a field effect transistor having a floating gate that may be used in the memory array created using the processes of the present invention.

FIG. 2 is a cross-sectional illustration of a floating gate field effect transistor which may be used in a memory cell or memory cell array constructed according to the teaches of the present invention. FIG. 2 illustrates a transistor 24 which is formed on a semiconductor substrate 26. A gate oxide layer 28 is formed on an outer surface of the substrate 26. A gate stack 30 is disposed outwardly from the gate insulator layer 28. Gate stack 30 comprises a floating gate conductor layer 32, an interstitial dielectric layer 34 and a control gate layer 36. Conductive layers 32 and 36 may comprise doped polysilicon. Interstitial dielectric layer 34 may comprise oxide or nitride or a heterostructure formed by alternate layers of oxide and nitride. Transistor 24 also includes a source region 38 and a drain region 40 which define between them a channel region 42 disposed inwardly from gate stack 30. The control conductor 36 is a continuous line connecting adjacent memory cells. In the context of the memory cell array discussed with reference to FIG. 1, the control gate 36 operates as the word line of the array. In contrast, the floating gate conductor 32 is not continuous with respect to adjacent cells but is a discrete conductive body for each cell within the array. As will be discussed herein, the etching steps which are used to form this discrete structure within the array create some difficulties with later etching steps which are used to form the combined stack structure 30 shown in FIG. 2.

Figure 3:
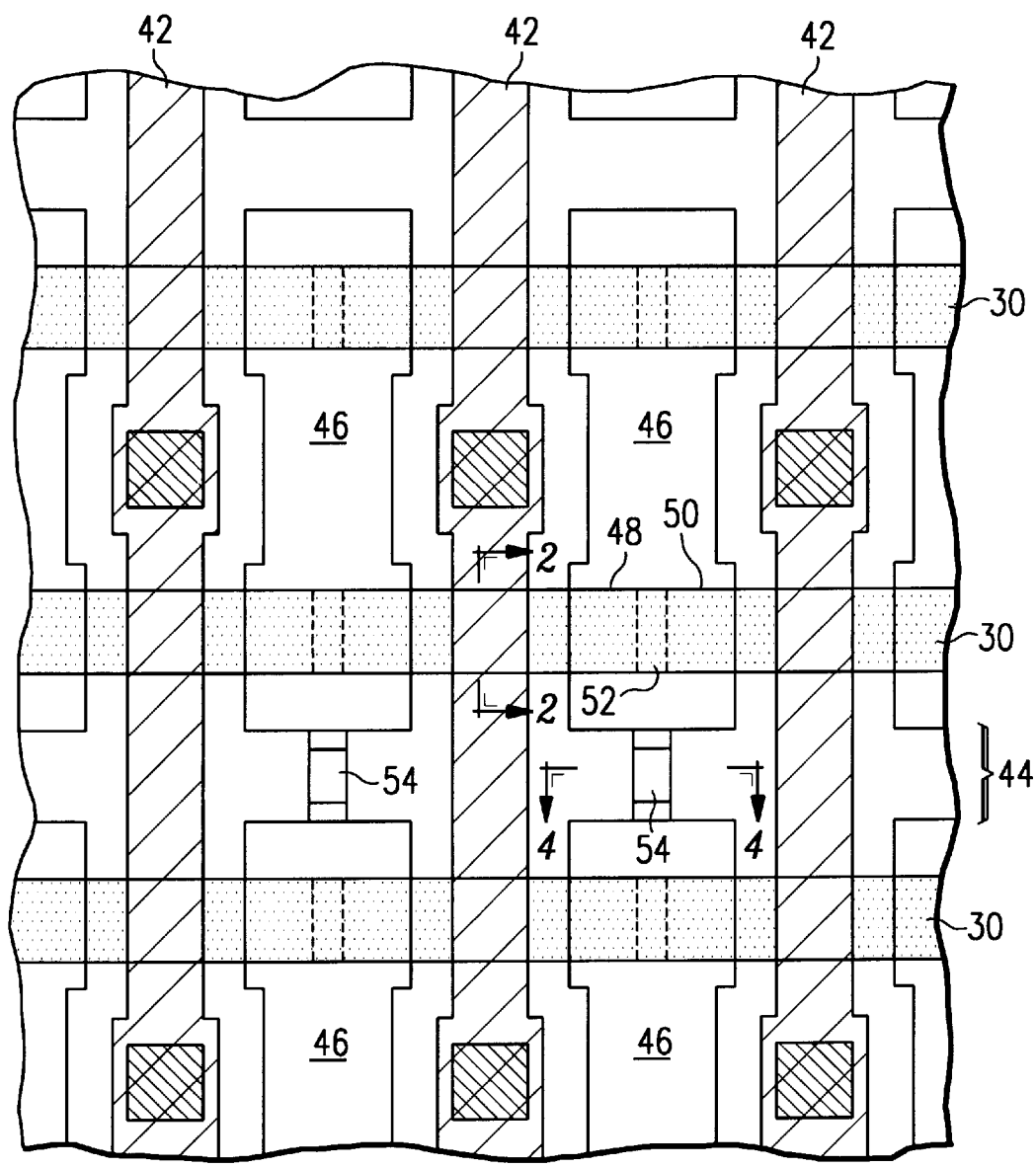
FIG. 3 is an enlarged plan view of a portion of a memory cell array which may be created using the processes of the present invention.

FIG. 3 is an enlarged plan view of a portion of the memory array. FIG. 3 illustrates at line II–II' the view which was illustrated as a cross section with reference to FIG. 2 previously. FIG. 3 illustrates a number of the continuous stack structures 30 discussed with reference to FIG. 2. In addition, disposed outwardly from the stack structures 30 and insulated therefrom are a number of perpendicular drain contacts 42 which operate to connect the drain regions of adjacent memory cells. All of the source regions in the array are connected one to another using a continuous diffused region within the outer surface of the semiconductor substrate on which the memory array is formed. One portion of the source region is indicated generally at 44 in FIG. 3. The field effect transistors within the memory cell array shown in FIG. 3 are separated from one another by isolation areas 46 shown in FIG. 3. Isolation areas 46 may be formed using shallow trench isolation structures which are formed by etching a trench on the order of one micron in depth into the substrate. The trench is then filled with suitable dielectric material which may comprise oxide or nitride or combinations thereof. Typically the dielectric material is etched back followed by a nitride deglaze to clear the surface of the substrate in the active regions between the isolation structures isolation areas 46. However, typically the dielectric material will extend above the surface of the substrate on the order of a few hundred Angstroms.

FIG. 3 also illustrates the separation of adjacent floating gate conductive bodies. For example, FIG. 3 illustrates that an exemplary floating gate conductive body 48 is separate from an adjacent floating gate conductive body 50 by a gap 52. Gap 52 is etched into the first layer of conductive material which is used to form the floating gate conductive bodies prior to the formation of the interstitial dielectric layer 34 or the control gate conductive body 36 discussed with reference to FIG. 2 previously. Prior to the etching process that is used to define the side walls of the stack structure 30 the gap 52 extends across the entire memory array. As will be discussed in more detail with reference to FIG. 4, the gap 52 creates a discontinuity in the topography of the layers immediately prior to the etching processes used to form the stack structure 30. This discontinuity can result in the etching of the substrate in the source region 44 associated with the gap 52. This can result in the formation of a unwanted hole or trench at locations such as those indicated at 54 in FIG. 3.

Figure 4A:
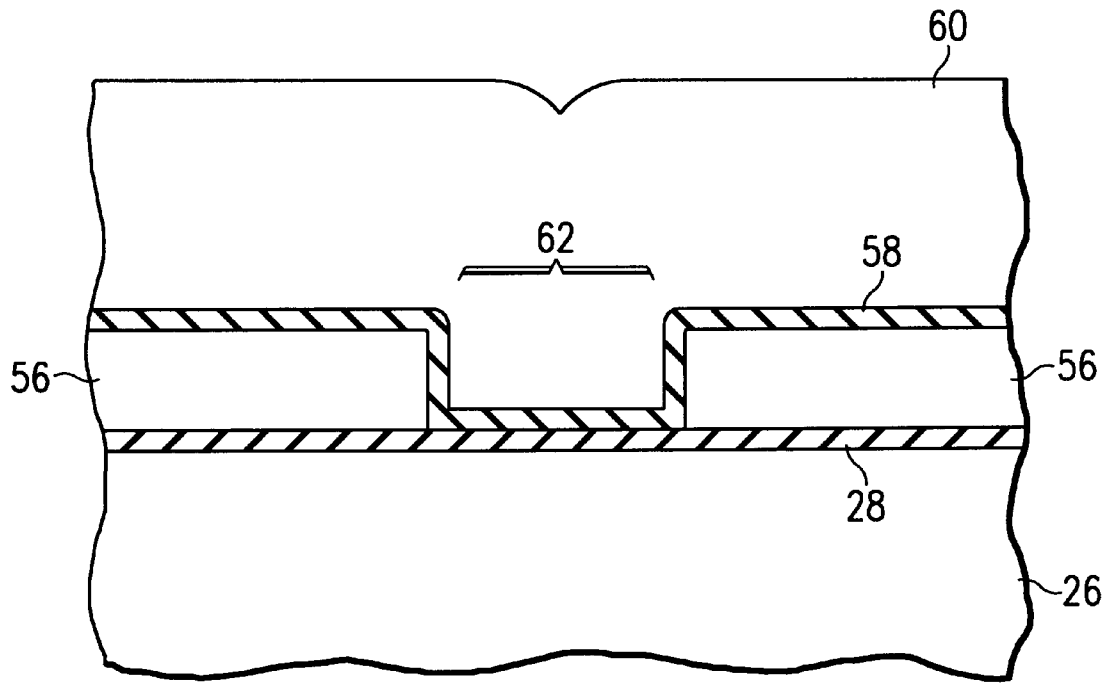
FIGS. 4A through 4B are enlarged cross-sectional elevational views of the topography and the result of conventional etch processes.

FIG. 4A is a cross sectional illustration taken along line IV–IV' in FIG. 3. FIG. 4 illustrates the substrate 26 covered by the gate oxide layer 28. Polysilicon layer 56 is shown disposed outwardly from portions of oxide layer 28. Polysilicon layer 56 is used to form the floating gate electrode 32 discussed previously with reference to FIG. 2. Similarly, a dielectric layer 58 is shown disposed outwardly from layer 56. Dielectric layer 58 is used to form interstitial dielectric layer 34. Finally, an outer layer of polysilicon 60 is disposed outwardly from dielectric layer 58. Polysilicon layer 60 is used to form control gate electrode 36 discussed previously. FIG. 4A clearly shows the notch indicated at 62 which exists in the layer 56. The notch 62 is formed to eventually isolate one floating gate electrode from each adjacent floating gate electrode. The topography shown in FIG. 4A exists prior to the stack etch step at stack etch process which is used to define the parallel elongated gate stacks 30 which were shown in FIG. 3.

Figure 4B:
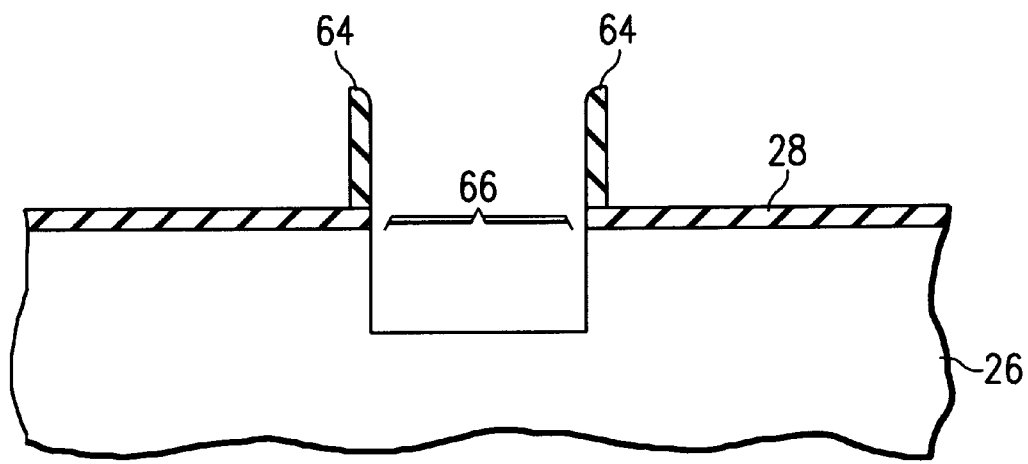
Figure 5A:
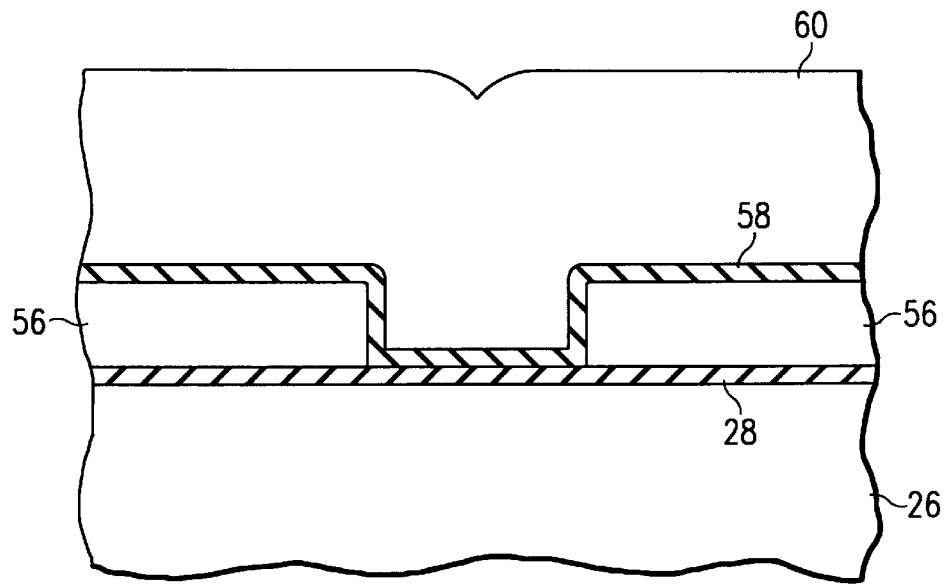
FIGS. 5A through 5C are enlarged cross-sectional elevational views of a portion of the memory cell array taken along the line IV—IV prime shown in FIG. 3 during various stages of the formation of the memory cell array according to the teaches of the present invention.
Figure 5B:
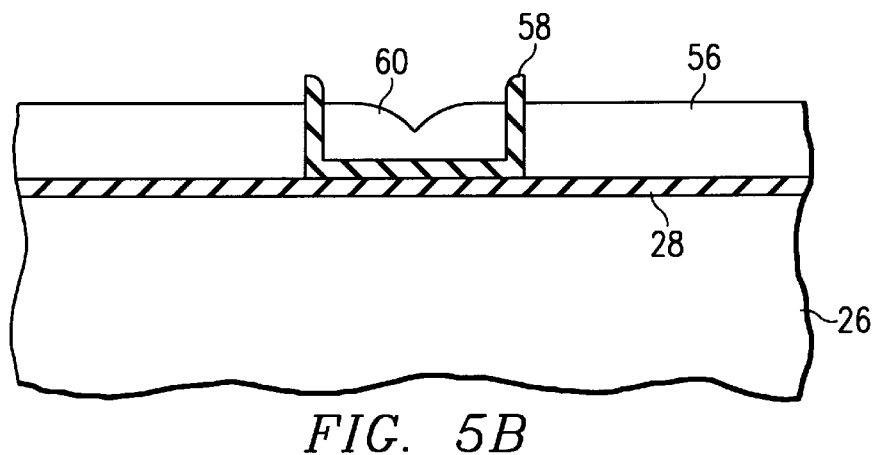
Figure 5C:
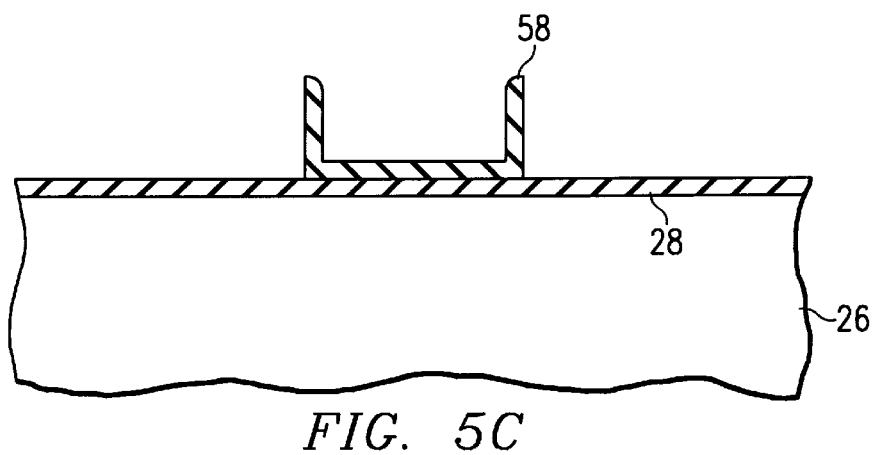

FIG. 4B is a cross sectional illustration of what could occur if conventional etch processes were used to perform the stack etch. As discussed previously the cross sectional view shown in FIGS. 4A and 4B are taken within the eventual source area 44 discussed with reference to FIG. 3. Conventional processes would utilize a three step etch process. The first etch process would be selective to polysilicon and would remove the portions of layer 60 that were not masked to form the gate stack structures 30 shown in FIG. 3. The second etch process would remove the dielectric layer 58 and would be selective to the dielectric materials and layer 58 so as not to etch substantially polysilicon layer 56. During this etch process, the etch will also remove the thin gate oxide layer 28 and expose the outer surface of substrate 26. Because of the selectivity of the second etch process the substrate itself will not be etched substantially. This second etch process will also leave dielectric ears 64 shown in FIG. 4B due to the profile of the dielectric layer 58. Finally, referring to FIG. 4B, the third etch process used would be selective to silicon and would remove the remaining polysilicon layer 56. This process will also etch the exposed portions of the substrate 26 and result in the formation of an unwanted trench in area indicated at 66 in FIG. 4B. This resulting trench will make it difficult to efficiently implant a continuous source region as carriers within this region will have to migrate along the surface of substrate 26 and under the trench 66 shown in FIG. 4B. This can substantially affect the conductivity of the source region 44 discussed with reference to FIG. 3 and the operation of the array. As such, a novel etch process which eliminates the formation of the unwanted trench 66 has been developed and is shown in FIGS. 5A–5C. FIG. 5A is a cross sectional illustration of the topography prior to the etch processes used to form the gate stack structures 30. FIG. 5A illustrates the substrate 26, the gate oxide layer 28, and polysilicon layers 56 and 60 separated by interstitial dielectric layer 58.

According to the teachings of the present invention, a novel two-step etch process is used to form the gate stack structures 30 which does not result in the formation of trench 66 in the array. According to the teachings of the present invention, a first etch process is used which is not substantially selective to either silicon or nitride. According to one embodiment of the present invention, a sulfur hexachloride and hydrogen bromide plasma etch process can be used to etch simultaneously layers 60, 58 and portions of 56. According to one embodiment of the present invention, this plasma etch process can proceed for 70 seconds at 20 militorr at a power of 275 watts in a magnetic field of 30 Gauss. The hydrogen bromide may be used at 10 SCCM and the sulfur hexachloride may be used at 25 SCCM. The cathode temperature and wall temperature can both be set at 40° C. and the back side helium pressure can be set at 4 torr. This process can be accomplished in a P-5000 plasma etch tool manufactured by applied materials in a 150 mm MxP polychamber.

The process detailed herein will result in the topography shown in FIG. 5B. The etch process can be completed by subjecting the topography shown in FIG. 5B to a second etch process which is highly selective to oxide. This process etches the remainder of layers 60 and 56 shown in FIG. 5B and results in the residual portion of layer 58 and the gate oxide layer 28 being left substantially not etched.

According to one embodiment of the present invention this highly selective etch process may be accomplished using a hydrogen bromide and helium oxygen mixture etch. The process can proceed for 120 seconds at 100 militorr with a power setting of 140 watts in a magnetic field of 20 Gauss. The hydrogen bromide can be introduced at 35 SCCM. A helium oxygen mixture with 20 percent oxygen can be introduced at 4 SCCM. The cathode and wall temperatures can be set at 40° C. with a backside helium pressure of 4 torr. Once again this etch process can be performed in the same P 5000 reactive ion etch tool manufactured by Applied Materials.

Using the novel etch processes described the gate stack structures 30 can be formed without creating unwanted trenches in the substrate 26 which could impact the performance and conductivity of the implanted source regions. Following the formation of the gate stack structures 30 the source and drain regions can be implanted using mask processes and self-aligned processes. Suitable contact regions and metal contacts may then be formed to connect the device and the array in accordance with the discussion in FIG. 1 using conventional processes.

In summary, a novel method of forming the central gate stack structures in a floating gate memory array is provided that allows for the efficient formation of the structures without the unwanted etching of the semiconductor substrate in other portions of the array. Although the present invention has been described in detail it should be understood that various changes, alternations and substitutions may be made here to the embodiments described herein without departing from the scope of the present invention which is solely defined by the appended claims.

What is claimed is:

1. A method of forming a memory array, comprising the steps of:

etching with a substantially nonselective etch process a semiconductor substrate having a first conductive layer formed outwardly from a surface of the semiconductor substrate and a second conductor layer formed outwardly from the first conductive layer wherein the first conductive layer is discontinuous such that portions of the second conductive layer are not separated from the surface of the semiconductor substrate by the first conductive layer, the first and second conductive layers separated by an interstitial dielectric layer, the substantially nonselective etch process operating to create a substantially planar layer having exposed portions of the first and second conductive layers through the nonselective etching of the first conductive layer, the interstitial dielectric layer and the second conductive layer; and etching the substantially planar outer surface with a second etch process highly selective to dielectric material such that the remaining portions of the first and second conductive layer are removed, the first conductive layer separated from the substrate surface by a gate dielectric layer, the second etch process operable to expose but not substantially etch the gate dielectric layer.

2. The method of claim 1 wherein the substantially nonselective etch process uses etchants comprising sulfur hexachloride.

3. The method of claim 1 wherein the substantially nonselective etch process uses etchants comprising hydrogen bromide.

4. The method of claim 1 wherein the highly selective second etch process uses etchants comprising hydrogen bromide.

5. The method of claim 1 wherein the highly selective second etch process uses helium.

6. The method of claim 1 wherein the substantially nonselective etch process uses a reactive ion plasma etch process.

7. The method of claim 1 wherein the highly selective second etch process uses a reactive ion plasma etch process.

8. The method of claim 1 wherein the gate dielectric and interstitial dielectric layers comprise oxide.

9. The method of claim 1 wherein the gate dielectric and interstitial dielectric layers comprise nitride.

10. The method of claim 1 wherein the conductive layers and the substrate comprise silicon.

11. A method of forming a flash EPROM memory array, comprising the steps of:

forming control stacks of transistors comprising the array by etching, using a substantially nonselective reactive ion plasma etch process comprising sulfur hexachloride and hydrogen bromide, a semiconductor substrate having a first conductive layer formed outwardly from a surface of the semiconductor substrate and a second conductor layer formed outwardly from the first conductive layer wherein the first conductive layer is discontinuous such that portions of the second conductive layer are not separated from the surface of the semiconductor substrate by the first conductive layer, the first and second conductive layers separated by an interstitial dielectric layer, the substantially nonselective etch process operating to create a substantially planar layer having exposed portions of the first and second conductive layers through the nonselective etching of the first conductive layer, the interstitial dielectric layer and the second conductive layer; and etching the substantially planar outer surface using a second reactive ion plasma etch process highly selective to dielectric material and comprising hydrogen bromide and helium such that the remaining portions of the first and second conductive layer are removed, the first conductive layer separated from the substrate surface by a gate dielectric layer, the second etch process operable to expose but not substantially etch the gate dielectric layer.

12. The method of claim 11 wherein the gate dielectric and interstitial dielectric layers comprise oxide.

13. The method of claim 11 wherein the gate dielectric and interstitial dielectric layers comprise nitride.

14. The method of claim 11 wherein the conductive layers and the substrate comprise silicon.

* * * * *